United States Patent
Gruenhagen et al.

(10) Patent No.: US 8,314,473 B2
(45) Date of Patent: Nov. 20, 2012

(54) DIE BACKSIDE STANDOFF STRUCTURES FOR SEMICONDUCTOR DEVICES

(75) Inventors: Michael Gruenhagen, Salt Lake City, UT (US); Thomas P. Welch, South Jordan, UT (US); Eric J. Woolsey, Draper, UT (US)

(73) Assignee: Fairchild Semiconductor Corporation, San Jose, CA (US)

( * ) Notice: Subject to any disclaimer, the term of this patent is extended or adjusted under 35 U.S.C. 154(b) by 290 days.

(21) Appl. No.: 12/773,552

(22) Filed: May 4, 2010

(65) Prior Publication Data

US 2011/0272792 A1    Nov. 10, 2011

(51) Int. Cl.
  *H01L 21/70* (2006.01)
(52) U.S. Cl. .................. 257/502; 438/612
(58) Field of Classification Search ........... 257/E21.508; 438/612
  See application file for complete search history.

(56) References Cited

U.S. PATENT DOCUMENTS

| | | | |
|---|---|---|---|
| 5,242,047 A | 9/1993 | Bonnet | |
| 5,957,364 A | 9/1999 | Socha | |
| 6,211,550 B1 * | 4/2001 | Grebs et al. | 257/342 |
| 6,392,144 B1 * | 5/2002 | Filter et al. | 174/535 |
| 7,569,935 B1 * | 8/2009 | Fan | 257/737 |
| 7,593,228 B2 | 9/2009 | Jarrett et al. | |
| 2002/0079577 A1 * | 6/2002 | Ho | 257/737 |
| 2005/0051352 A1 * | 3/2005 | Aoki | 174/52.1 |
| 2005/0093153 A1 * | 5/2005 | Liu | 257/738 |
| 2005/0156325 A1 * | 7/2005 | You Yang | 257/779 |
| 2007/0166877 A1 * | 7/2007 | Otremba | 438/106 |
| 2009/0261457 A1 * | 10/2009 | Pratt | 257/621 |

* cited by examiner

*Primary Examiner* — Fernando L Toledo
*Assistant Examiner* — Peter Bradford
(74) *Attorney, Agent, or Firm* — Kenneth E. Horton; Kirton McConkie, PC

(57) ABSTRACT

Standoff structures that can be used on the die backside of semiconductor devices and methods for making the same are described. The devices contain a silicon substrate with an integrated circuit on the front side of the substrate and a backmetal layer on the backside of the substrate. Standoff structures made of Cu of Ni are formed on the backmetal layer and are embedded in a Sn-containing layer that covers the backmetal layer and the standoff structures. The standoff structures can be isolated from each other so that they are not connected and can also be configured to substantially mirror indentations in the leadframe that is attached to the Sn-containing layer. Other embodiments are described.

19 Claims, 2 Drawing Sheets

DIE BACKSIDE STANDOFF STRUCTURES FOR SEMICONDUCTOR DEVICES

FIELD

This application relates generally to semiconductor devices and methods for making such devices. More specifically, this application relates to standoff structures that can be used on the die backside in semiconductor devices and methods for making the same.

BACKGROUND

Semiconductor devices containing integrated circuits (ICs) are used in a wide variety of electronic apparatus. The IC devices (or chips) comprise a miniaturized electronic circuit that has been manufactured in the surface of a substrate of semiconductor material. The circuits are composed of many overlapping layers, including layers containing dopants that can be diffused into the substrate (called diffusion layers) or ions that are implanted (implant layers) into the substrate. Other layers are conductors (polysilicon or metal layers) or connections between the conducting layers (via or contact layers).

IC devices can be fabricated in a layer-by-layer process that uses a combination of many steps, including imaging, deposition, etching, doping and cleaning. Silicon wafers are typically used as the substrate and photolithography is used to mark different areas of the substrate to be doped or to deposit and define polysilicon, insulators, or metal layers. One of the latter steps in the semiconductor fabrication process forms the electrical connections between the circuitry and the other electrical components in the electronic apparatus of which the IC chip is a part. While older technology utilized wire bonding, newer technology includes flip chip bonding processes where the active side of the IC chip is bonded to an electrical circuit of the printed circuit board (PCB) through solder bumps deposited either on the IC chip or the PCB.

SUMMARY

This application relates to standoff structures that can be used on the die backside of semiconductor devices and methods for making the same. The devices contain a silicon substrate with an integrated circuit on the front side of the substrate and a backmetal layer on the backside of the substrate. Standoff structures made of Cu of Ni are formed on the backmetal layer and are embedded in a Sn-containing layer that covers the backmetal layer and the standoff structures. The standoff structures can be isolated from each other so that they are not connected and can also be configured to substantially mirror indentations in the leadframe that is attached to the Sn-containing layer. With such a configuration, the semiconductor devices can be manufactured with a small size and without the need to use Pb.

BRIEF DESCRIPTION OF THE DRAWINGS

The following description can be better understood in light of the Figures, in which.

Figure 1:
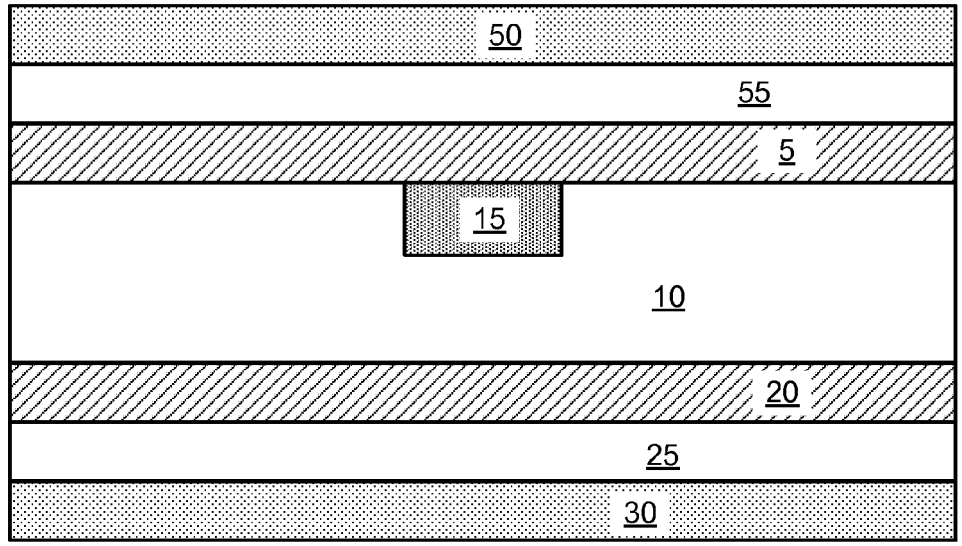
FIG. 1 shows some embodiments of methods for forming a semiconductor device containing a backmetal layer.

The Figures illustrate specific aspects of the semiconductor devices and methods for making such devices. Together with the following description, the Figures demonstrate and explain the principles of the methods and structures produced through these methods. In the drawings, the thickness of layers and regions are exaggerated for clarity. It will also be understood that when a layer, component, or substrate is referred to as being "on" another layer, component, or substrate, it can be directly on the other layer, component, or substrate, or intervening layers may also be present. The same reference numerals in different drawings represent the same element, and thus their descriptions will not be repeated.

DETAILED DESCRIPTION

The following description supplies specific details in order to provide a thorough understanding. Nevertheless, the skilled artisan would understand that the devices and associated methods of making and using the devices can be implemented and used without employing these specific details. Indeed, the devices and associated methods can be placed into practice by modifying the illustrated devices and associated methods and can be used in conjunction with any other apparatus and techniques conventionally used in the industry. For example, while the description below focuses on methods for making for semiconductor devices in the IC industry, it could be used in and applied to other electronic devices like optoelectronic devices, solar cells, MEMS structures, lighting controls, power supplies, and amplifiers.

Some embodiments of the semiconductor devices and methods for making such devices are shown in FIGS. 1-4. In these embodiments, the methods for making the semiconductor devices begin by providing a substrate 10 (or wafer), as shown in FIG. 1. The substrate 10 may be made of any known semiconductor material. Some non-limiting examples of such materials may include silicon, gallium arsenide, silicon carbide, gallium nitride, silicon and germanium, and combinations thereof. In some embodiments, the substrate 10 comprises a silicon wafer with an epitaxial layer of Si deposited thereon. The silicon wafer and/or the epitaxial layer can be undoped or doped with any known dopant, including boron (B), phosphorous (P), and arsenic (As).

Next, as known in the art, any known integrated circuit (IC) device 15 can be formed in or on the substrate 10 using any known processing. Some non-limiting examples of these IC devices may include logic or digital IC devices, linear regulators, audio power amplifiers, LDO, driver IC, diodes, and/or transistors, including zener diodes, schottky diodes, small signal diodes, bipolar junction transistors ("BJT"), metal-oxide-semiconductor field-effect transistors ("MOSFET"), insulated-gate-bipolar transistors ("IGBT"), and insulated-gate field-effect transistors ("IGFET"). In some embodiments, the IC device 15 comprises a trench MOSFET device that can be made using any process known in the art. In other embodiments, the IC device 15 comprises a double-diffused metal-oxide-semiconductor (DMOS) device. In yet other embodiments, the IC device 15 comprises any device containing a backside drain contact.

In some embodiments, a gate layer 5 can be formed on the upper surface of the substrate 10. The gate layer 5 can be connected to the IC device 15 and serves as a gate for the IC device. In these embodiments, the gate layer 5 can be made of any conductive material such as Al, polysilicon, silicon/nickel silicide, or silicon/cobalt silicide and can be made by any process known in the art. In some instances, further processing, such as forming an interconnect (not shown) or forming a gate pad (not shown), can be performed on the upper surface of the gate layer 5 as known in the art. These steps on the front side of the substrate 10 are used as part of the processing to manufacture a completed integrated circuit device.

Next, a carrier can be applied to the front side of the substrate 10. The carrier 50 may have any characteristic that allows it to support the substrate 10 (and the components formed thereon) and be used with the methods described herein. In some embodiments, the carrier 50 can be fabricated of glass, PYREX®, silicon, or other materials. While the carrier 50 can have any suitable shape or size, in some embodiments the carrier 50 has a form factor that is similar to the substrate 10.

The carrier can be attached to the substrate 10 using any known procedure. In some embodiments, an adhesive layer 55 can be applied to either the upper surface of the substrate 10 and/or the bottom surface of the carrier 50. The adhesive layer 55 is used to attach the carrier 50 to the substrate 10. The adhesive layer 55 can be made of any adhesive material that can be removed later, such as a bonding adhesive LC3200 or LC4200 (both sold by 3M) or bonding adhesives available from Brewer Science. In some embodiments, known wafer handling robotics may be used to pick and place the carrier 50 onto the substrate 10.

Next, the backside of the substrate 10 can be thinned using any known process in the art, including using any known polishing or grinding process. In some embodiments, the backside can be thinned by grinding the backside by using a diamond abrasive wheel, removing the grinding tape from the front side, and then performing a Stress Relief Etch (SRE) process using a wafer backside etching tool, such as those made by the SEZ Group or Materials and Technologies Corporation (MaTech). In some embodiments, the substrate 10 can be thinned to a thickness from about 500 to about 5 μm. In other embodiments, the substrate 10 can be thinned to a thickness just below the active gate transistor structure of the dopant activated source, channel, and drain regions.

Then, a backmetal layer can be formed on the backside of the substrate 10. In some embodiments, the backmetal layer comprises TiNiVAg Au, TiNiVAgAu, TiNiPd, Al AlNiVAg, AlNiVAgAu, NiAg, NiAgAu, or any combinations of. In other embodiments, the backmetal layer comprises a contact layer comprising Cr, Ti, Ni or Al, a soldering layer comprising Ni, NiV, or Cu, and an oxidation prevention layer comprising Ag, Au, or Pd. In these embodiments, the contact layer 20 can be formed on the backside of the substrate 10 as shown in FIG. 1 so that it is adjacent the drain of the IC device 15. The contact layer 20 operates as silicon-to-metal interface and/or adhesion layer between the substrate 10 and the to-be-formed soldering metal layer (as described herein). In some embodiments, the contact layer 20 comprises Al, Cr, Au, Ni, Ti, or alloy of these materials. The material for the contact layer can be formed by a chemical vapor deposition (CVD) process, a physical vapor deposition (PVD) process, or a sputtering process until the desired thickness of the contact layer 20 is formed.

In these embodiments, a soldering layer 25 can then be formed on the contact layer 20 as shown in FIG. 1. The soldering layer 25 operates to react with Sn in the solder layer as well as act as a diffusion barrier layer. The soldering layer 25 can comprise any metal that forms a metal Sn intermetallic layer under soldering conditions. Accordingly, in some embodiments, the soldering layer 25 can comprise substantially pure Ni, Cu, NiV (with the V concentration being about 7 wt %), NiTi (with the Ti concentration ranging from about 2 to about 98 wt %), or combinations thereof. The soldering layer 25 can be formed using any known deposition process, including a CVD process, an evaporation process, or a PVD sputtering process until the desired thickness is formed.

Next, in the embodiments shown in FIG. 1, an oxidation prevention layer 30 can be formed on the soldering layer 25. The oxidation prevention layer 30 is formed to prevent the soldering layer 25 from being oxidized during subsequent processing. This oxygen prevention layer 30 can contain any material that will reduce or prevent oxidation of the material used in the soldering layer 25. In some embodiments, the oxidation prevention layer 30 comprises Ag, Au, Pd, Cu, or combinations thereof. The oxidation prevention layer 30 can be formed using any deposition process, including CVD or sputter deposition, until the desired thickness is obtained.

Figure 2:
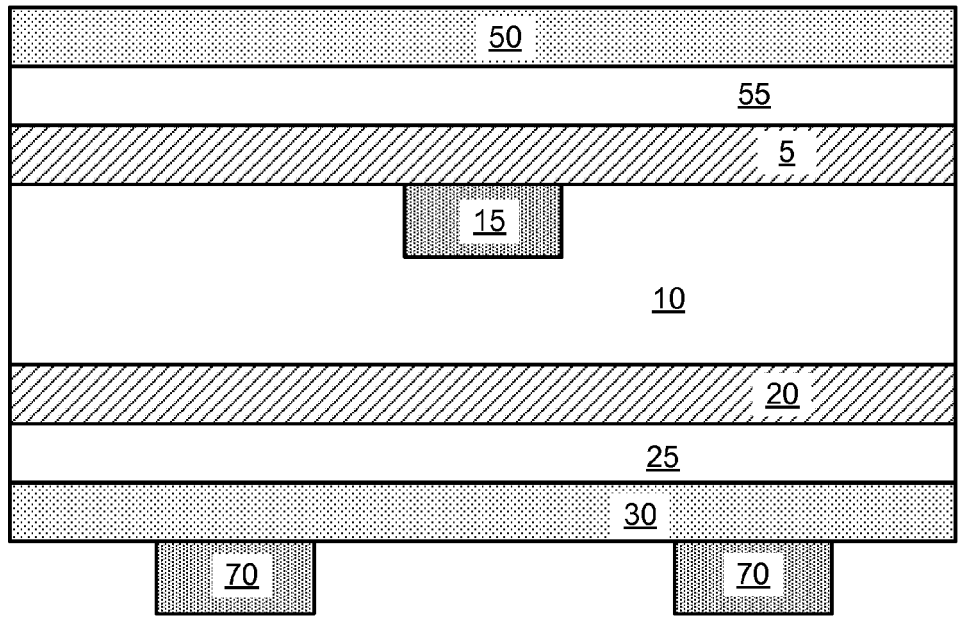
FIG. 2 depicts some embodiments of methods for forming a semiconductor device containing standoff structures formed on the backmetal layer.

Next, standoffs structures 70 are formed on a portion of the surface of the backmetal layer (which can be the oxidation reducing layer 30 as shown in FIG. 2). The standoff structures 70 can be formed of any solderable material known in the art which reacts with Sn under soldering conditions, including Cu, Ni. NiV, NiTi (with the Ti concentration ranging from about 2 to about 98 wt %), or combinations thereof. In some embodiments, the standoff structures comprise Cu or Ni since these materials react with Sn, are electricity and thermally conductive, and are accordingly referred to as metal standoffs.

The metal standoffs 70 can be formed by any process yielding a structure with the features described herein. In some embodiments, the metal standoffs 70 can be formed by CVD deposition, sputtering, or electroplating the metal (i.e., Cu or Ni) used in the metal standoff until the desired thickness of the metal layer is formed.

After the metal layer has been deposited, the standoff structures 70 can be formed using any mask and etch process known in the art. In some embodiments, the standoff structure can be formed by depositing a photoresist layer and then patterning it as known in the art to form a mask layer. An etching process is then performed using the mask to remove unwanted portions of the metal layer, while leaving the desired portions of the metal layer (i.e., the standoff structures) remaining. The etching process can be performed using any etchant that does not attack the photoresist layer or the oxidation prevention layer 30. In some embodiments, the etching process can be performed using $HNO_3$ as the etchant, or other acids that etch the metal. The photoresist can then be removed using any known stripping process, including a stripping process using acetone or other solvents that will not stain the backmetal layer The metal standoffs 70 can have any thickness that will not fully react with Sn in Pb-free die attach systems after multiple heat exposures. In some embodiments, the thickness of the metal standoffs can range from about 0.1 to about 100 μm. In other embodiments, the thickness of the metal standoffs can range from about 2 to about 50 μm. In yet other embodiments, the thickness of the metal standoffs can be about 10 μm.

The standoff structures can be configured with any shape that can minimize across-die warp effects caused by the difference in thermal expansion rates of metals relative to silicon, that can prevent a horizontal brittle fracture plane of SnNi or SnCu intermetallics, and/or that can act as a dam to minimize horizontal solder spreading. In some configurations, the metal standoffs 70 can be configured as isolated islands with no connections between each standoff structure and any adjacent standoff structure. In other embodiments, the standoff structures can be configured to have a plug shape as shown in the Figures which substantially matches the indents in the leadframe, thereby helping to lock the leadframe to the die. The numbers of metal standoffs can range from one standoff to hundreds of standoffs depending on the needs of the die to leadframe configuration.

The process for making the semiconductor device continues when a de-plating process is performed on the structure to remove the surface oxides as illustrated in FIG. 2. Any de-plating process known in the art can be used to remove the surface oxides. In some embodiments, the de-plating step comes before the plating step and in some configurations using the same plating bath as the next plating step. The transition from de-plating to plating can occur with a switch in electrode bias.

Figure 3:
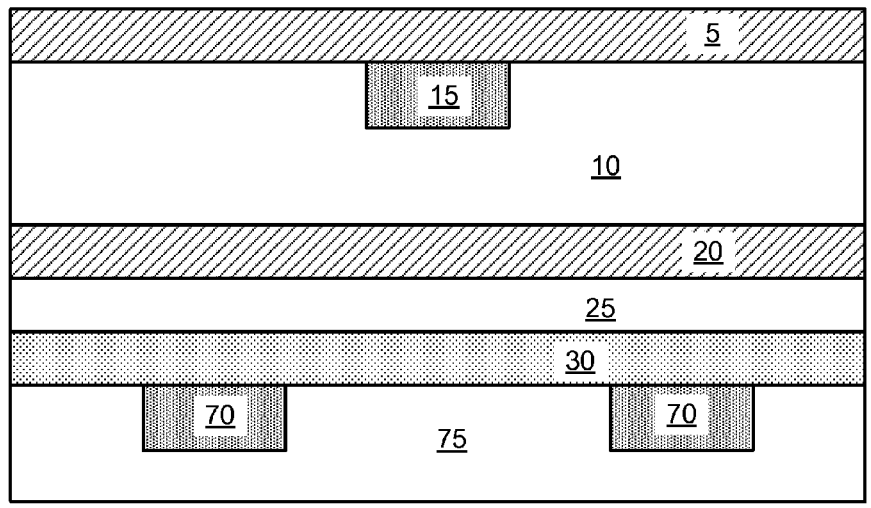
FIG. 3 shows some embodiments of methods for forming a semiconductor device containing a Sn-containing layer on the standoff structures and the backmetal layer.
Figure 4:
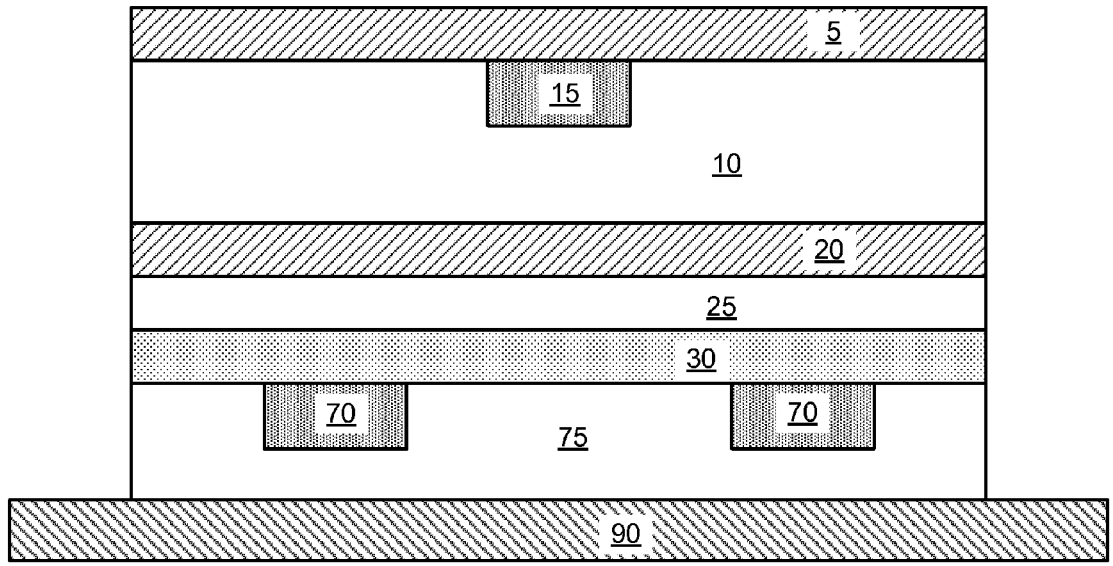
FIG. 4 depicts some embodiments of methods for forming a semiconductor device containing a lead frame connected to the Sn-containing layer.

Next, the structure shown in FIG. 2 can be provided with a Sn-containing layer 75. The Sn-containing layer can comprise of a pure Sn plated layer or co-plated layers of SnAg, SnPb, SnBi, SnCu, or SnSb. The Sn-containing layer covers the standoff structures 70 and fills in the areas between the standoff structures, as shown in FIG. 3. The Sn-containing layer 75 can be formed using any process known in the art. In some embodiments, the Sn-containing layer 75 can be formed with any known plating process, such as electroplating or electroless ion exchange reaction, and is performed until the desired thickness is obtained. In some embodiments, the thickness of the Sn-containing layer 75 can range from about 0.2 to about 200 µm. In other embodiments, the thickness of the Sn-containing layer 75 can be slightly thicker than the metal standoffs.

Next, the carrier 50 and the adhesive layer 55 can be removed from the substrate 10. In some embodiments, the carrier 50 can be removed by de-bonding it from the adhesive layer 55 by treating the structure with a solvent such as acetone or by exposing a light reactive layer to a laser. The adhesive layer 55 can then be peeled away from the front side of the substrate 10.

Next, the substrate 10 (which is often in the form of a wafer) can be separated into individual dies by any known dicing process. Then, the individual dies are attached to the die attach pad (DAP) of a lead frame 90 using any process known in the art. In some embodiments, the dies can be attached to the lead frame using a soldering process. In the soldering process, the die can be attached directly to a die attach pad on the leadframe without the use of an epoxy or solder dot on the leadframe. The die can be heated to reflow and react the Sn in the Sn-containing layer to the solderable metal in the leadframe.

The lead frame 90 can comprise any conductive material known in the art. In some embodiments, the lead frame 90 comprises Cu, Cu alloys, or Invar and the die attach pad comprises a solderable metal layer with an oxidation prevention layer coating. The lead frame 90 can be connected to the die including soldering. A reflow process is then performed, which causes the plated Sn or Sn metal blend to partially react with the backmetal layer(s) and with the solder metal layer in the lead frame 90, thereby reflowing the metal in the solder into the shape of a thin film layer (not shown) along the entire leadframe and die backside. The lead frame 90 can then be connected to the IC device 15 using any wire bonding process known in the art.

The resulting structure can then be encapsulated in any known molding material to make a semiconductor package, such as an epoxy molding compound, a thermoset resin, a thermoplastic material, or a potting material. The package can then be singulated using any process known in the art, including a saw singulation process or a water jet singulation process, or a laser-cut singulation method. Then, the singulated semiconductor packages may be electrically tested, taped, and reeled using any processes known in the art. The semiconductor packages can then be connected to a printed circuit board using any known connection (i.e., solder connectors) and used in any electronic device known in the art such as portable computers, disk drives, USB controllers, portable audio devices, or any other portable electronic devices.

The semiconductor devices contain Cu and/or Ni stand-off structures that are embedded within the Sn-containing layer. The standoff structures are located between the die attach solder layer (formed from the solder paste) and the die backmetal layer. The stand-off structures can be placed in any desired pattern to provide the best package reliability for temperature cycling and power cycling performance. The stand-off structures can also be configured to substantially mirror the indentations in the die attach paddle (DAP) of the leadframe, thereby creating an interlocking mechanism that can reduce or prevent rotation of the die relative to the leadframe.

The stand-off structures can also improve the uniformity of the bond line thickness—even in overflow conditions—because they reduce or eliminate both die tilting and die cracking. Both of these conditions can contribute to manufacturing problems with wirebonding, clip alignment, cracked die edges, and exposed die surfaces. The stand-off structures can also reduce or prevent the formation of intermetallic horizontal facture planes since if a horizontal crack begins to form, it will be halted when it runs into the standoff structure rather than continue along the entire metal layer.

The stand-off structures can also reduce or eliminate the drain-to-source shorting that can occur from die attach solder bleeds and solder splashing, especially under overflow conditions with thinner dies. The stand-off structures can reduce or prevent the solder from wicking around the sides and up the die side, which can cause such drain-to-source shorts. This feature becomes more important as the die size shrinks, especially below 2 mils.

The stand-off structures can also reduce or eliminate the die warp from thick solder layers that can cause die attach and other problems. Thick Cu or Ni sheets can often be needed for lead-free soldering. These sheets can warp the die relative to the adjacent Si layer due to differences in the material stress and the coefficient of thermal expansion properties of Si when compared to Ni or Cu. But having discrete stand-off structure can break up the bulk film stress of the Ni or Cu sheets.

The stand-off structures also create areas of improved thermal and electrical conductivity since Cu and Ni are more conductive than Sn. As well, the stand-off structures can provide thick solderable locations for reaction with the fast reacting Sn-containing material, a feature that becomes more important the less Pb that is contained in the solder. The stand-off structures can also be configured to reduce or prevent the formation of thick metal layers in the die streets which can be difficult to saw during the singulation process.

The semiconductor devices also contain a Sn-containing layer over the backside of the entire die. This feature can be useful to directly attach the die to the DAP of the leadframe, which is very useful for small and/or thin dies. Thus, no solder or epoxy is needed on the die attach pad of the leadframe since the die is directly attached to the leadframe without an intermediate solder or epoxy.

The thick Cu and/or Ni stand-off structures provide extra material for the Sn layer to react to. The Sn-rich (and Pb-free) layer can react with, and thereby consume, the Ni at a very high rate during the soldering process. The Ni consumption by the SAC solder can result in cracks, intermetallic compound (IMC) spalling, and under-bump-metal (UBM) delamination, especially when all of the Ni (or Cu) is consumed. The cracks are caused by the relatively low ductility of Ni and can result in brittle fractures across the solder joint. The IMC spalling can be caused by the IMC grains detaching themselves from the solder interface during reflow processing. This detachment causes this interface to be brittle due to voids or cracks that can be introduced into the SAC solder/Ni interface when the IMC grains grow larger. Thus, the UBM to solder delamination results in the layers underlying the soldering layer peeling away from each other, causing a broken interconnect and reliability degradation.

The Cu and/or Ni stand-off structures that are embedded within the Sn-containing layer can improve the operation and reliability of small and thin dies. With these features, the die thickness can, in some embodiments, be less than about 4 mils. In other embodiments, this thickness can range from about 1 to about 4 mils thick. And with these features, the die size can, in some embodiments, be about 4 by about 50 mils.

In some embodiments, a semiconductor device can be made by the method comprising: providing a silicon substrate containing an integrated circuit with a drain on a backside of the substrate; providing a backmetal layer on the backside of the substrate; providing isolated standoff structures on the backmetal layer, the standoff structures having a thickness ranging from about 0.1 to about 100 μm; and providing a Sn-containing layer covering the standoff structures and the backmetal layer.

In other embodiments, a wafer level chip scale package can be made by the method comprising: providing a substrate with an integrated circuit near the front surface; providing a backmetal layer on back surface of the substrate; depositing a Ni or Cu layer on the backmetal surface, the Ni or Cu layer having a thickness ranging from about 0.1 to about 100 μm; etching the Ni of Cu layer using a mask to form isolated standoff structures on the backmetal layer which are not connected to each other; depositing a Sn-containing layer to cover the backmetal layer and the standoff structures; and connecting the Sn-containing layer to a leadframe.

In addition to any previously indicated modification, numerous other variations and alternative arrangements may be devised by those skilled in the art without departing from the spirit and scope of this description, and appended claims are intended to cover such modifications and arrangements. Thus, while the information has been described above with particularity and detail in connection with what is presently deemed to be the most practical and preferred aspects, it will be apparent to those of ordinary skill in the art that numerous modifications, including, but not limited to, form, function, manner of operation and use may be made without departing from the principles and concepts set forth herein. Also, as used herein, examples are meant to be illustrative only and should not be construed to be limiting in any manner.

The invention claimed is:

1. A semiconductor device, comprising:
   a silicon substrate containing an integrated circuit having a drain on a backside of the substrate;
   a backmetal layer on the backside of the substrate;
   isolated standoff structures having a first surface and a second, opposite surface on the backmetal layer, the standoff structures having a thickness ranging from about 0.1 to about 100 μm;
   a Sn-containing layer covering the first surface of the standoff structures and the backmetal layer; and
   a leadframe connected to the Sn-containing layer.

2. The device of claim 1, wherein the standoff structures are not connected to each other.

3. The device of claim 1, wherein the standoff structures have a thickness ranging from about 2 to about 50 μm.

4. The device of claim 1, wherein the standoff structures have a thickness of about 10 μm.

5. The device of claim 1, where the leadframe contains a die attach pad with a pattern of indentations and the standoff structures are configured with a substantially similar pattern that matches the indentations.

6. The device of claim 1, wherein the backmetal layer comprises:
   a contact layer contacting the drain on the backside, the contact layer comprising Ti, Al, or Cr;
   a soldering layer on the contact layer, the solder layer containing Ni, Cu, Ni(Ti), Ni(V), and combinations thereof; and
   an Au-containing oxidation prevention layer on the soldering layer.

7. The device of claim 1, wherein the standoff structures comprise NiV, Ni(Ti), Ni, or Cu.

8. A semiconductor device, comprising:
   a silicon substrate containing an integrated circuit having a drain on a backside of the substrate;
   a backmetal layer on the backside of the substrate;
   isolated standoff structures having a first surface and a second, opposite surface on the backmetal layer which are not connected to each other, the standoff structures having a thickness ranging from about 0.1 to about 100 μm;
   a Sn-containing layer covering the first surface of the metal standoff structures and the backmetal layer so that the standoff structures are embedded within the Sn-containing layer; and
   a leadframe connected to the Sn-containing layer.

9. The device of claim 8, wherein the standoff structures comprise Ni, Cu, NiV, or Ni(Ti).

10. The device of claim 8, wherein the standoff structures have a thickness ranging from about 2 to about 50 μm.

11. The device of claim 8, wherein the standoff structures have a thickness of about 10 μm.

12. The device of claim 8, where the leadframe contains a die attach pad with a pattern of indentations and the standoff structures are configured with a substantially similar pattern that matches the indentations.

13. The device of claim 8, wherein the backmetal layer comprises:
   a contact layer contacting the drain on the backside, the contact layer comprising Ti;
   a soldering layer on the contact layer, the solder layer containing Ni or Cu; and
   an Au-containing oxidation prevention layer on the soldering layer.

14. An electronic apparatus, comprising:
   a printed circuit board;
   and a semiconductor device connected to the printed circuit board, the device comprising:
      a silicon substrate containing an integrated circuit having a drain on a backside of the substrate;
      a backmetal layer on the backside of the substrate;
      isolated standoff structures having a first surface and a second, opposite surface on the backmetal layer which are not connected to each other, the standoff structures having a thickness ranging from about 0.1 to about 100 μm;

a Sn-containing layer covering the first surface of the metal standoff structures and the backmetal layer so that the standoff structures are embedded within the Sn-containing layer; and a leadframe connected to the Sn-containing layer.

15. The apparatus of claim 14, wherein the standoff structures comprise Ni or Cu.

16. The apparatus of claim 14, wherein the standoff structures have a thickness ranging from about 2 to about 50 μm.

17. The apparatus of claim 14, wherein the standoff structures have a thickness of about 10 μm.

18. The device of claim 1, wherein the Sn-containing layer covers the entire backside of the semiconductor device.

19. The device of claim 8, wherein the Sn-containing layer covers the entire backside of the semiconductor device.

\* \* \* \* \*